United States Patent
Jalan et al.

(10) Patent No.: US 9,602,107 B2
(45) Date of Patent: Mar. 21, 2017

(54) RESET SELECTION CELL TO MITIGATE INITIALIZATION TIME

(71) Applicant: TEXAS INSTRUMENTS INCORPORATED, Dallas, TX (US)

(72) Inventors: Saket Jalan, Bangalore (IN); Abhishek Ganapati Karkisaval, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/581,296

(22) Filed: Dec. 23, 2014

(65) Prior Publication Data
US 2016/0182020 A1    Jun. 23, 2016

(51) Int. Cl.
H03K 3/02        (2006.01)
H03K 19/173     (2006.01)
H03K 3/037      (2006.01)

(52) U.S. Cl.
CPC ......... H03K 19/1737 (2013.01); H03K 3/037 (2013.01)

(58) Field of Classification Search
USPC ....... 327/115, 116, 117, 118, 142, 143, 161, 327/185, 198–203, 208–218, 355–360, 327/403–419; 377/47, 48
See application file for complete search history.

(56) References Cited

U.S. PATENT DOCUMENTS

| | | | |
|---|---|---|---|
| 7,657,722 B1 * | 2/2010 | De Angel | G06F 21/71 365/185.04 |
| 9,000,958 B1 * | 4/2015 | Park | H03H 17/0628 341/50 |
| 2009/0089637 A1 * | 4/2009 | Jun | G01R 31/318541 714/729 |
| 2010/0090739 A1 * | 4/2010 | Huang | G06F 1/10 327/176 |
| 2010/0322078 A1 * | 12/2010 | Wang | H04L 12/12 370/241 |
| 2012/0026779 A1 * | 2/2012 | Ikegami | G11C 13/0002 365/148 |
| 2012/0099382 A1 * | 4/2012 | Wu | G11C 7/04 365/189.02 |
| 2013/0194880 A1 * | 8/2013 | Wu | G11C 7/04 365/189.15 |
| 2013/0205160 A1 * | 8/2013 | Turner | G06F 5/12 713/400 |
| 2014/0181605 A1 * | 6/2014 | Lingannagari | G06F 11/3656 714/727 |
| 2014/0247672 A1 * | 9/2014 | Wu | G11C 7/12 365/189.02 |
| 2014/0281775 A1 * | 9/2014 | Shanker | G01R 31/31705 714/727 |
| 2015/0029876 A1 * | 1/2015 | Ogata | H04J 3/047 370/252 |
| 2015/0222271 A1 * | 8/2015 | Singh | H03K 3/017 327/115 |

* cited by examiner

*Primary Examiner* — Brandon S Cole
(74) *Attorney, Agent, or Firm* — Lawrence J. Bassuk; Charles A. Brill; Frank D. Cimino

(57) ABSTRACT

A circuit includes a state capture device to capture a logic state of a reset selection cell in response to a logic state input. A cell reset node defines a reset state of the reset selection cell. A selection device passes the captured logic state from the state capture device or the reset state from the cell reset node to an output of the reset selection cell based on a state of a control input to the selection device.

8 Claims, 4 Drawing Sheets

RESET SELECTION CELL TO MITIGATE INITIALIZATION TIME

TECHNICAL FIELD

This disclosure relates to integrated circuits, and more particularly to a reset selection cell to mitigate initialization time and power consumption of an integrated circuit.

BACKGROUND

Today's complex integrated circuits such as a system on a chip (SOC) need a considerable number of blocks to be initialized before the SOC can begin to perform its intended operation. Initialization time has a two-fold impact on SOC performance. One impact relates to the delay in commencing of the actual SOC functionality. For instance, several systems require the SOC to respond in a time bound manner after the power on. In such systems, the delay (e.g., waiting for circuit reset) in commencing actual functionality is detrimental. Another impact during initialization relates to consumption of power while the internal modules of the SOC are being configured.

In some systems, such as WLAN and Bluetooth, the power consumed during the initialization phase is significant where a typical SOC may contain several hundred registers which need initialization at reset. For example, a given application SOC may contain over 8000 bits for radio frequency (RF) configuration alone. This is apart from the large number of registers within various SOC modules. At the time of initial testing of the SOC, register reset values are not known and thus could change significantly in later SOC versions. This requires either the processor to change register contents (which consumes time/power), or an integrated circuit change in which the reset functionality is changed via multi-level mask changes which can cost hundreds of thousands of dollars.

SUMMARY

This disclosure relates to a reset selection cell to mitigate initialization time and power consumption of an integrated circuit. In one example, a circuit includes a state capture device to capture a logic state of a reset selection cell in response to a logic state input. A cell reset node defines a reset state of the reset selection cell. A selection device passes the captured logic state from the state capture device or the reset state from the cell reset node to an output of the reset selection cell based on a state of a control input to the selection device.

In another example, a circuit includes a reset selection cell to provide reset functionality for an integrated circuit system. A state capture device captures a logic state of the reset selection cell in response to a logic state input. A cell reset node defines a reset state of the reset selection cell. A selection device passes the captured logic state from the state capture device or the reset state from the cell reset node to an output of the reset selection cell based on a state of a control input to the selection device. A register stores a control bit to control the control input. The control bit controls which of the captured logic state from the state capture device or the reset state from the cell reset node are passed to the output of the reset selection cell during a reset state of the integrated circuit system.

In yet another example, a circuit includes a state capture device that receives an input and generates an output. At least two cell reset nodes provide at least two reset outputs. A selection device having at least two control inputs direct which of the output of the state capture device or one of the at least two reset outputs from the at least two cell reset nodes are passed to an output of the selection device.

DETAILED DESCRIPTION

This disclosure relates to a reset selection cell to mitigate initialization time and power consumption of an integrated circuit. The reset selection cell includes a control architecture where the logic state or reset state of the cell can be passed to a cell output based on a control input provided to the cell. Rather than providing a conventional register or flip-flop reset/preset functionality utilizing clocked resets, the reset selection cell utilizes the control input to determine which of the logic state or the reset state of the cell is passed to the cell output based on assertion of the control input. By utilizing a control input signal rather than a clock input to trigger reset for the cell, reset initialization time can be decreased which also saves power during system initialization periods where resets are asserted.

The reset selection cell includes a state capture device to capture a logic state of the reset selection cell in response to a logic state input. The state capture device can be a flip-flop for example which does not include preset or reset functionality to simplify its integrated circuit footprint. A cell reset node defines a reset state of the reset selection cell. The cell reset node can define a high state or a low state representing the reset state of the cell and can be easily set via a single layer integrated circuit change. A selection device (e.g., multiplexor) passes the captured logic state from the state capture device or the reset state from the cell reset node to an output of the reset selection cell based on a state of the control input to the selection device.

Figure 1:
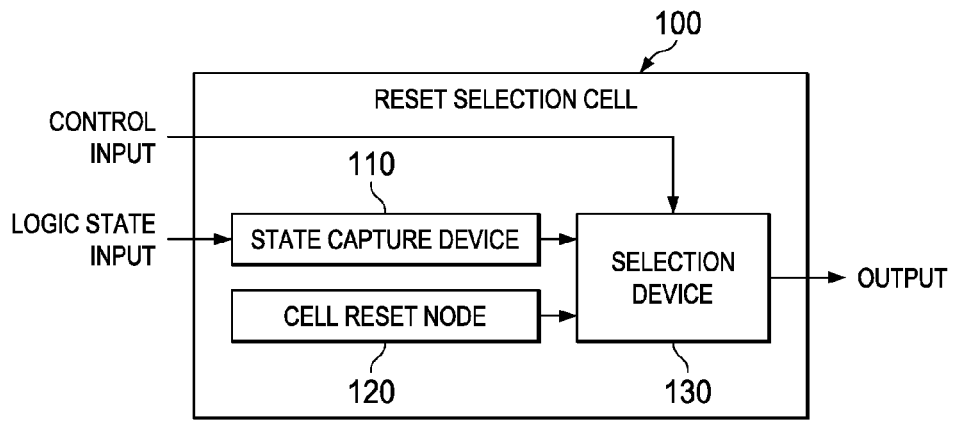
FIG. 1 illustrates an example of a reset selection cell to mitigate initialization time and power consumption of an integrated circuit.

FIG. 1 illustrates an example of a reset selection cell 100 to mitigate initialization time and power consumption of an integrated circuit. As used herein, the term circuit can include a collection of active and/or passive elements that perform a circuit function such as a processing circuit or logic circuit, for example. The term circuit can also include an integrated circuit where all the circuit elements are fabricated on a common substrate, for example. The reset selection cell 100 includes a state capture device 110 to capture a logic state of the reset selection cell in response to a logic state input. The state capture device 110 can be a flip-flop (e.g., D, RS, JK, T, latch) for example. The state capture device 110 generally does not include set or reset functionality to simplify its integrated circuit footprint.

A cell reset node 120 defines a reset state of the reset selection cell 110. The cell reset node 120 can define a high state or a low state representing the reset state of the cell 110 and can be easily set via a single layer integrated circuit change (e.g., cell reset node tied high or low via mask change). A selection device 130 (e.g., multiplexor, logic switching circuit) passes the captured logic state from the state capture device 110 or the reset state from the cell reset node 120 to an output of the reset selection cell 100 based on a state of the control input (e.g., high or low) to the selection device. Although a single control and reset state device 100 is illustrated, multistate reset and control devices are possible as illustrated and described below with respect to FIG. 6.

The reset selection cell 100 can be employed to provide efficient reset/programming functionality via the cell output for integrated circuits such as a system on a chip (SOC) (not shown) that can include hundreds if not thousands of circuits requiring initialization at power up and beyond (e.g., midstream functional state changes). For instance, complex SOC's need a considerable number of blocks to be initialized before the SOC can begin to perform its intended operation. Each block of the SOC thus can be reset or programmed via the output from the reset selection cell 100. Initialization time can have a two-fold impact on SOC performance. This includes delay in commencing of the actual functionality during reset where several systems require the SOC to respond in a time bound manner post power-on (e.g., registering a CAN unto a CAN interface). In such systems, the delay in commencing actual functionality can be detrimental. Consumption of power while the internal modules of the SOC are being configured during reset is another consideration. In certain systems, such as WLAN and Bluetooth, the power consumed during the initialization is significant. If the SOC were to contain the desired reset values at power on, it can significantly reduce the task of configuration. The reset selection cell 100 can be manufactured via a single layer mask change via the cell reset node 120 to provide the desired reset values for the SOC at power-on while also obviating the need for conventional synchronous clocked reset schemes.

In radio frequency modules (RF) modules, for example, it is not possible to fully characterize the silicon behavior of the SOC prior to manufacturing. In some examples, several system optimizations are performed post the silicon characterization step which can lead to changes in RF register configurations. In Mixed signal SOC's such as WLAN and Auto Radar, the RF control registers typically have to switch between two states one for example for the receiver (RX) and another for transmitter (TX), or between states where the bits enable/disable the controlled logic. Thus, there are strict timing requirements for switching between states (e.g., a 10 us limit on transitioning from RX to TX in WLAN system. At the time of initial implementation of silicon, the RF register reset values are not known and could change significantly in later integrated circuit versions. This can require either the processor to change register contents (which would consume time/power), or a silicon mask change in which the reset flip-flops are changed and timing of the design is subsequently performed. As will be illustrated and described below, control and register schemes can be provided to capture and assert the state of the control input to the reset selection cell 100 which facilitates efficient resetting or changing of SOC functionality between one state and another (e.g., between RX and TX states).

Figure 2A:
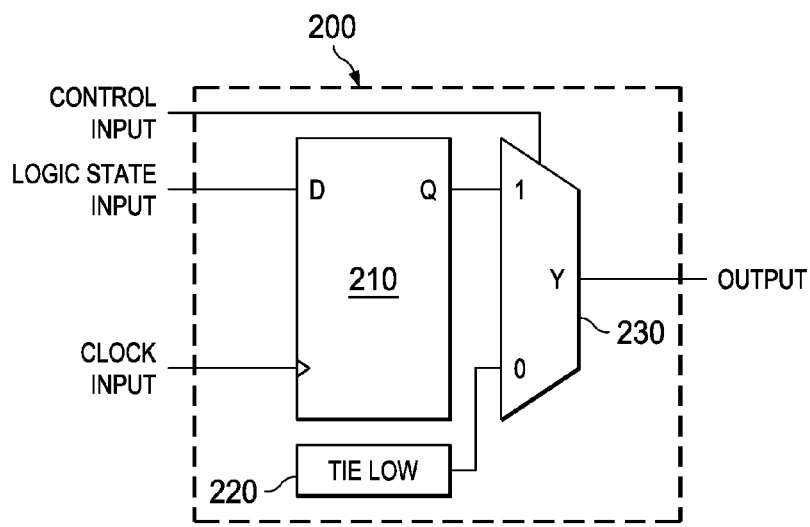
FIGS. 2A and 2B illustrate alternative circuit examples for a reset selection cell.
Figure 2B:
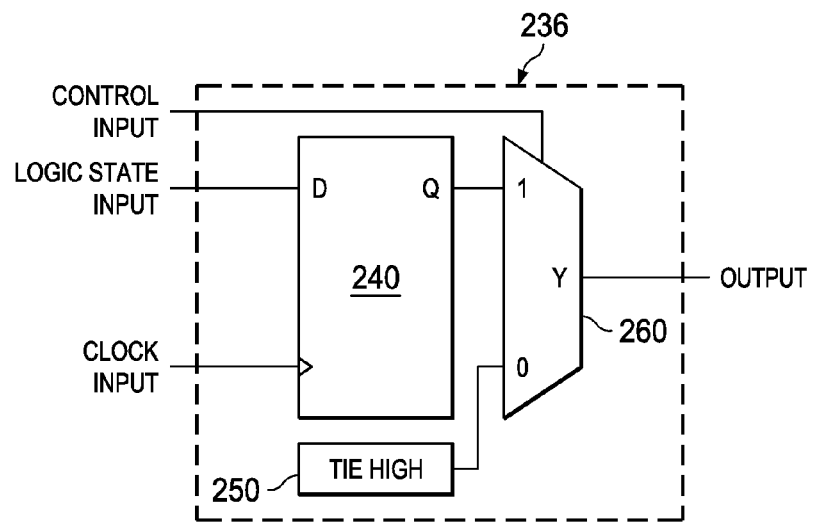

FIGS. 2A and 2B illustrate alternative circuit examples for a reset selection cell. With respect to FIG. 2A, a reset selection cell 200 is illustrated. The reset selection cell 200 includes a D flip-flop 210 acting as a state capture device for the cell 200. As noted above, substantially any type of flip-flop or latching device can be employed as a state capture device for the cell 200. A tie low node 220 is provided as the cell reset node described above. Thus, in this example, the reset state of the cell 200 is defined as low. A multiplexor 230 (MUX) is provided as the selection device for the cell 200. In this example, if a control input is driven to a logic "one", output from the flip-flop 210 is passed to the output of the cell 200 via MUX 230. If the control input is driven to a logic "zero," output from the tie low node 220 is supplied to the cell output via MUX 230. As shown, the flip flop receives a logic state input and clock input to capture the respective logic state of the cell 200.

With respect to FIG. 2B, an alternative reset selection cell 236 is illustrated. The reset selection cell 236 includes a D flip-flop 240 acting as a state capture device for the cell 236. In this example, a tie high node 250 is provided as the cell reset node described above. Thus, in this example, the reset state of the cell 200 is defined as high. A multiplexor 260 (MUX) is provided as the selection device for the cell 236. In this example, if a control input is driven to a logic "one", output from the flip-flop 240 is passed to the output of the cell 236 via MUX 260. If the control input is driven to a logic "zero," output from the tie high node 250 is supplied to the cell output via MUX 260. As shown, the flip flop receives a logic state input and clock input to capture the respective logic state of the cell 236. The respective flip-flops 210 and 240 in FIGS. 2A and 2B do not include preset or reset functionality in these examples to conserve integrated circuit and silicon costs.

Figure 3:
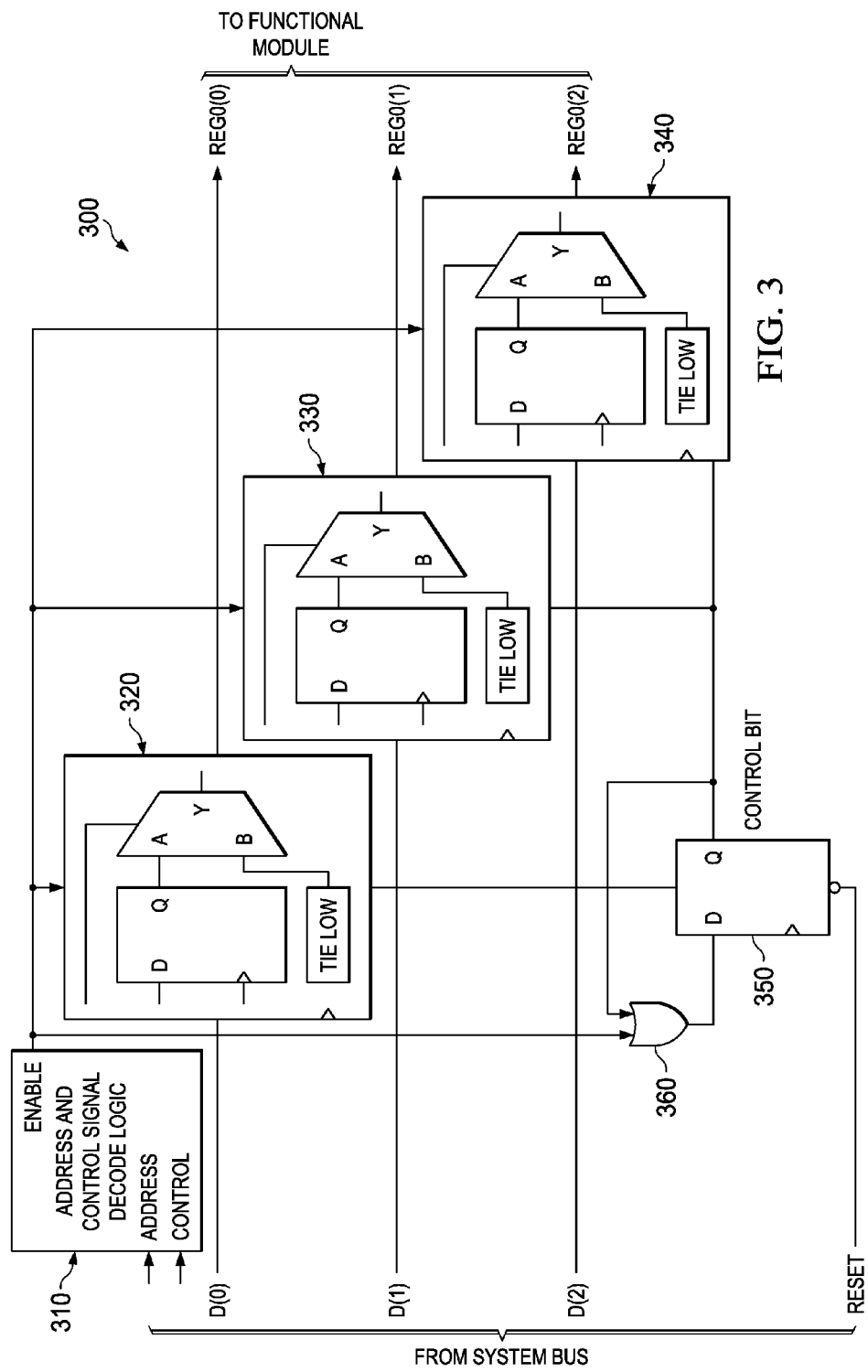
FIG. 3 illustrates an example of a circuit to control a plurality of reset selection cells.

FIG. 3 illustrates an example of a circuit 300 to control a plurality of reset selection cells. The circuit 300 includes an address and control signal decode logic block 310 (also referred to as logic block) that enables operations of reset select cells 320 through 340. Although only three such cells 320 through 340 are shown, more than three cells can be provided. Each of the respective cells 320 through 340 receive logic state inputs from data bits D0 through D2. A reset input sets a control bit output of flip-flop 350 which drives a control input to each of the cells 320 through 340. When reset, each of the cells 320-340 provides its respective tie high or tie low input to an output of each cell which is shown as REG(0) though REG(3). When a write is applied to the cells 320 though 340 via bits D0 thorough D3, the written value is captured in the respective flip-flops (or state capture device) in each cell and also the control bit is set to 1 via gate 360. As a result, the respective cell's value now is provided at the output instead of the value from the respective tie hi/lo cell representing the cell reset value for each cell. If the reset value of the respective cell flip-flop needs a change in the subsequent device revision, then it is a simple metal change of connecting the appropriate tie signal to the cell selection device as illustrated and described below with respect to FIG. 4.

Figure 4:
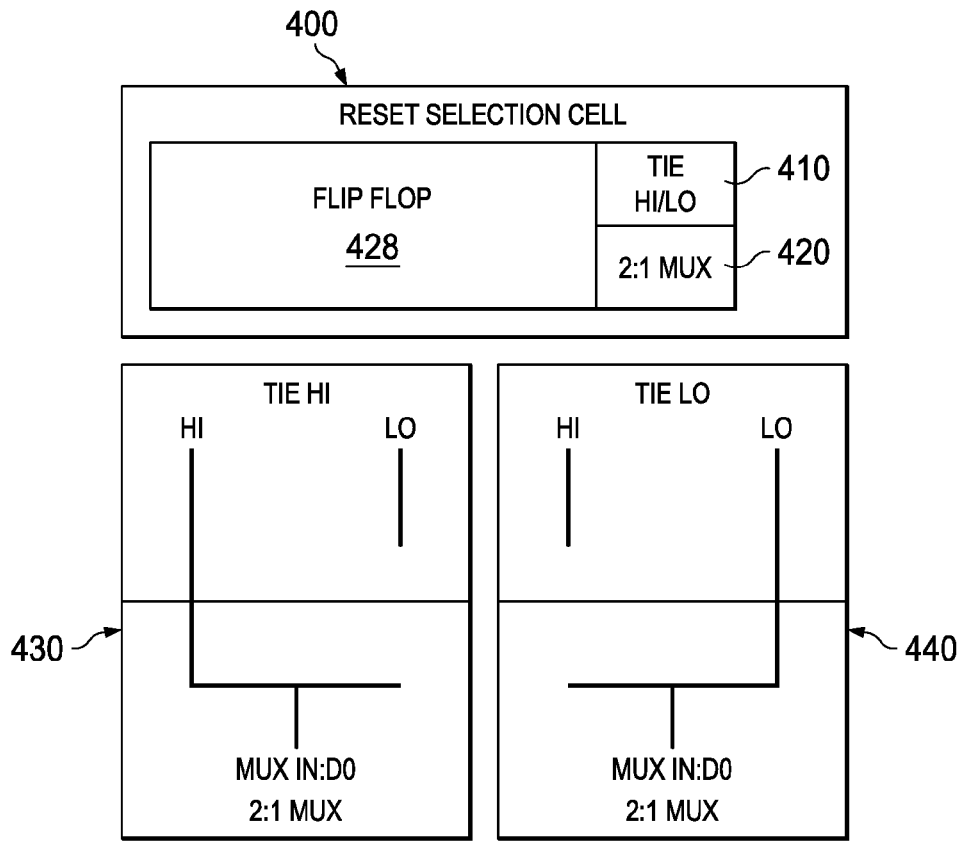
FIG. 4 illustrates an example of a single layer integrated circuit change to program a single layer reset selection cell.

FIG. 4 illustrates an example of a single layer integrated circuit change to program a single layer reset selection cell. An example reset selection cell 400 includes a tie hi/lo block 410 representing a cell reset node that feeds a 2:1 multiplexer 420 in this example. The tie hi/lo cell 410 representing the reset state of the cell can be implemented as a single layer mask change on an integrated circuit. For example, at 430, the cell reset state is defined as high since the multiplexer input is tied to a logic high value. At 440, the cell reset state is defined as a logic low since the multiplexer input is tied to a logic low value. In some examples, there can be two versions of the modified reset select cell. Version 1 of the cell can have the tie hi output of the Tie Hi/Lo Cell connected to the D0 input (or other input designated to pass the reset state) of the 2:1 MUX. Version 2 of the cell can have the tie lo output of the Tie Hi/Lo Cell connected to the D0 input of the 2:1 MUX if an opposite reset state is needed. Physically, the two cells differ only in a single metal layer (e.g., metal 1 or metal 2). If in a device revision, the reset value of the cell needs to be changed from 1 to 0 or vice versa, then all that is required is to replace cell 1 with cell 2 as a direct delete of the old cell and insert of new cell via available integrated circuit design tools. Thus, there is substantially no impact on the design timing closure and also there are no physical cell movements. This speeds up the backend closure of the device and also does not require a design re-testing timing cycle.

Figure 5:
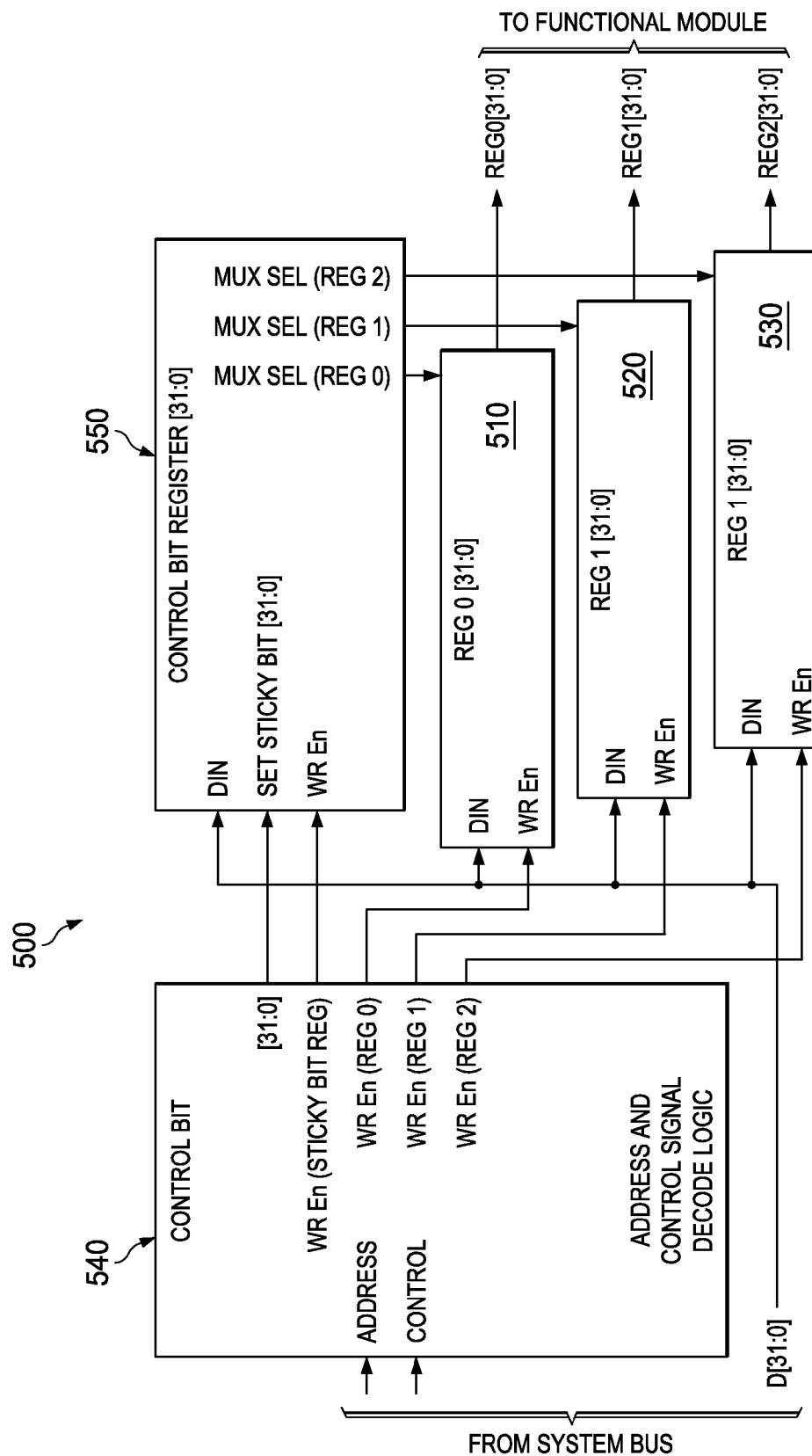
FIG. 5 illustrates an example of a register and control circuit to control a reset selection cell

FIG. 5 illustrates an example of a register and control circuit 500 to control a reset selection cell. Referring briefly back to FIG. 3, a single register was employed to capture the state of the control input to the selection device of reset selection cells. In one example, the register stores reset states representing the control inputs for a subset of reset select cells and stores non-reset states representing control inputs for another subset of reset select sells in another example. With respect to FIG. 5, multiple registers 510 through 530 can be employed where a subset of registers stores reset states representing the control inputs for a subset of reset select cells and another subset of registers stores non-reset states representing control inputs for another subset of reset select sells. In this example, a logic circuit 540 drives a control register 550 and the respective registers 510 though 530. The circuit 500 provides for a mechanism by which the reset state of the registers can be restored in a fast manner (e.g., 32× speed up). Each set of 32 control bits can be combined into one single writeable register 550. In order to restore a set of 32 registers, for example, to their reset value in a synchronous manner, the user can write a value 32x0 to the 32 bit wide control bit register 550. The user can also select which registers 510 though 530 should be reset and which should not.

Figure 6:
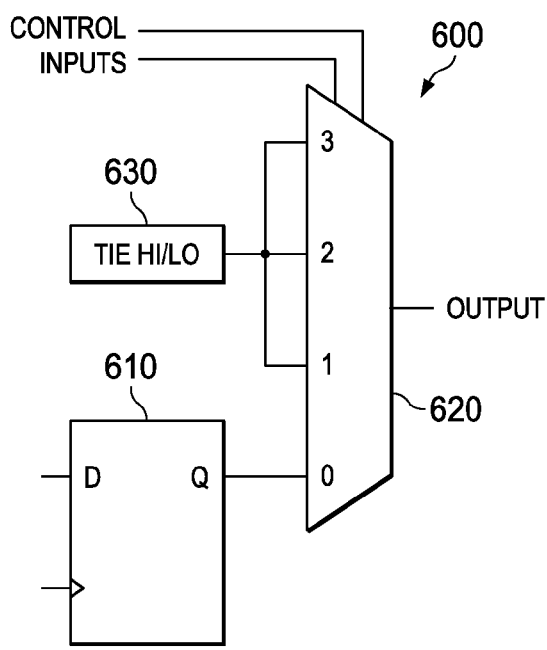
FIG. 6 illustrates an example of a reset selection cell that includes multiple control and reset states for the cell.

FIG. 6 illustrates an example of a reset selection cell 600 that includes multiple control and reset states for the cell. In this example, a state capture device flip-flop 610 having and input and output to drive one input of a multiplexer 620 which can multiplex multiple inputs via multiple control inputs. Although a two-control input circuit representing four multiplexer inputs is shown, higher control multiplexer circuits are possible (e.g., 3 input control representing switching of 8 MUX inputs). As shown, inputs of the MUX 620 not connected to the output of the state capture device 610 can be tied to multiple tie hi/lo cell outputs at 630. For instance, two of the MUX inputs could be tied high while a third MUX input is tied low. Thus, based on the state of the control inputs, differing reset states can be passed to the output of the MUX 620. The state capture device 610 receives an input and generates an output, where at least two cell reset nodes at 630 provide at least two reset outputs. The MUX 620 is one example of a selection device having at least two control inputs to direct which of the output of the state capture device 610 or one of the at least two reset outputs from the at least two cell reset nodes at 630 are passed to an output of the selection device.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit comprising:
    (a) a first state capture device having a first data input, a clock input, and a first data output, and being free of any reset input;
    (b) a first cell reset node having a first node output coupled to a first reset logic state;
    (c) a first selection device having a first input coupled to the first data output, a second input coupled to the first node output, a selection output, and a first control input, the selection device selectively coupling a signal on the first input or second input to the selection output in response to a control signal on the control input;
    (d) a single bit control register having a reset input, a clock input, and a first control bit output coupled to the first control input of the first selection device;
    (e) a second cell reset node having a second node output coupled to a second reset logic state different from the first reset logic state, and
    (f) a second selection device having a second node input coupled to the second node output and a second control input coupled to the single bit control register.

2. The integrated circuit of claim 1 in which the state capture device includes a flip-flop.

3. The integrated circuit of claim 1 in which the first reset logic state is one of a high reset logic state or a low reset logic state.

4. The integrated circuit of claim 1 in which the selection device includes a multiplexer.

5. An integrated circuit comprising:
    (a) a first state capture device having a first data input, a clock input, and a first data output, and being free of any reset input;
    (b) a first cell reset node having a first node output coupled to a first reset logic state;
    (c) a first selection device having a first input coupled to the first data output, a second input coupled to the first node output, a selection output, and a first control input, the selection device selectively coupling a signal on the first input or second input to the selection output in response to a control signal on the control input;
    (d) a single bit control register having a reset input, a clock input, and a first control bit output coupled to the first control input of the first selection device;
    (e) a second state capture device having a second data input and a second data output, and being free of any reset input, the second data input being separate from the first data input;
    (f) a second cell reset node having a second node output coupled to one of a high or a low reset logic state; and
    (g) a second selection device having a first input coupled to the second data output, a second input coupled to the second node output, a selection output, and a first control input coupled to the first control bit output, the second selection device selectively coupling a signal on the first input or second input to the selection output in response to a control signal on the first control input.

6. An integrated circuit reset selection circuit comprising:
    (a) data leads and reset register output leads;

(b) a first state capture device having a first data input connected to a data lead, a clock input, and a first data output, and being free of any reset input;

(c) a first cell reset node providing a first reset logic state;

(d) a first selection device having a first input coupled to the first data output, a second input coupled to the first reset node, a selection output connected to a reset register output lead, and a first control input, the selection device selectively coupling a signal on the first input or second input to the selection output in response to a control signal on the control input; and (e) a single bit control register having a reset input, a clock input, and a first control bit output coupled to the first control input of the first selection device.

7. The circuit of claim 6 in which the signal bit control register has a control bit input, and including a logic gate having an input connected to the control bit output and an output connected to the control bit input.

8. The circuit of claim 6 including:

(a) a second state capture device having a second data input connected to a data lead, and a second data output, and being free of any reset input, the second data input being separate from the first data input;

(b) a second cell reset node providing one of a high or a low reset logic state; and (c) a second selection device having a first input coupled to the second data output, a second input coupled to the second cell reset node, a selection output connected to a reset register output, and a first control input coupled to the first control bit output, the second selection device selectively coupling a signal on the first input or second input to the selection output in response to a control signal on the first control input.

* * * * *